(12) United States Patent
Tamada

(10) Patent No.: US 6,503,665 B1
(45) Date of Patent: Jan. 7, 2003

(54) PHASE SHIFT MASK AND SEMICONDUCTOR DEVICE FABRICATED WITH THE PHASE SHIFT MASK

(75) Inventor: Naohisa Tamada, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/428,479

(22) Filed: Oct. 28, 1999

(30) Foreign Application Priority Data

Jun. 11, 1999 (JP) .............................. 11-165899

(51) Int. Cl.⁷ ................................................ G03F 9/00
(52) U.S. Cl. .......................................................... 430/5
(58) Field of Search ............................ 430/5, 322, 323, 430/324

(56) References Cited

U.S. PATENT DOCUMENTS 4,849,313 A * 7/1989 Chapman et al. .............. 430/5
5,817,439 A * 10/1998 Tzu et al. ...................... 430/5
5,948,573 A * 9/1999 Takahashi ...................... 430/5
6,114,072 A * 9/2000 Narimatsu ..................... 430/5

FOREIGN PATENT DOCUMENTS

| JP | 7-152145 | 6/1995 |
| JP | 8-220732 | 8/1996 |

* cited by examiner

Primary Examiner—Mark F. Huff
Assistant Examiner—Saleha R. Mohamedulla
(74) Attorney, Agent, or Firm—McDermott, Will & Emery

(57) ABSTRACT

A shading member is mounted on the upper side of a corner portion of a shading zone area corresponding to an area causing triple exposure with an adhesive. It is possible to provide a phase shift mask capable of readily exposing a semiconductor substrate with no bad influence on adjacent exposed areas.

7 Claims, 14 Drawing Sheets

US 6,503,665 B1

PHASE SHIFT MASK AND SEMICONDUCTOR DEVICE FABRICATED WITH THE PHASE SHIFT MASK

BACKGROUND OF THE INVENTION

1. Field of the Invention

The present invention relates to a phase shift mask and a technique relevant thereto, and more specifically, it relates to a shading member provided on a phase shift mask employed for a step of exposing a semiconductor device.

2. Description of the Background Art

FIG. 10 schematically illustrates the structure of an exposure unit employed for a conventional step of exposing a semiconductor device. In this exposure unit, an exposure light source 21 emits exposure light 22 having a prescribed exposure wavelength. The emitted exposure light 22 is transmitted through condenser lenses 23a and 23b, and the exposure area thereof is adjusted by a blind 24.

The exposure light 22 having the adjusted exposure area is transmitted through condenser lenses 23c and 23d, and thereafter transmitted through a phase shift mask (including a reticle mask throughout the specification) 25 formed with a prescribed pattern layout.

The exposure light 22 transmitted through the phase shift mask 25 is adjusted to a prescribed exposure area by projection lenses 26a and 26b and an NA diaphragm 28, and thereafter exposes a semiconductor substrate 14 placed on a stage 30.

The semiconductor substrate 14 is sequentially formed with exposed areas 31 and 32 due to X-Y directional movement of the stage 30 (step-and-repeat system), and the pattern layout of the phase shift mask 25 is exposed over the entire surface of the semiconductor substrate 14.

The pattern layout of the phase shift mask 25 is roughly classified into an LSI circuit pattern area 27 and a non-exposed area 20. The LSI circuit pattern area 27 is formed with a pattern structure by a phase shift method capable of exposing a fine pattern, in order to satisfy the recent requirement for refinement of semiconductor devices.

With reference to FIGS. 11(A) and 11(B), the basic principle of a halftone phase shift method, representing the phase shift method, is now described. FIG. 11(A) is a sectional view of a halftone phase shift mask, and FIG. 11(B) illustrates the intensity of exposure light transmitted through the halftone phase shift mask on a semiconductor substrate.

Referring to FIG. 11(A), a transmission area 34 and a phase shifter area 33 are formed on a transparent substrate 4 in this halftone phase shift mask. Part of the exposure light transmitted through the phase shifter area 33 is so adjusted that the phase thereof is converted by 180° and the transmittance is about 2 to 40% with respect to that transmitted through the transmission area 34. Thus, in the exposure light transmitted through the halftone phase shift mask having the structure shown in FIG. 11(A), light components 180° 0 out of phase overlap and cancel with each other in the vicinity of the boundary between the phase shifter area 33 and the transmission area 34. Consequently, an area having light intensity of zero is formed in the vicinity of the boundary between the phase shifter area 33 and the transmission area 33, as shown on a light intensity curve 35 in FIG. 11(b).

The intensity of the part of the exposure light transmitted through the phase shifter area 33 is adjusted to a level (line L1 in FIG. 11(B)) not exposing a target film provided on the semiconductor substrate, by adjusting the transmittance of the phase shifter area 33. Thus, exposure of a fine pattern corresponding to the transmission area 34 provided on the halftone phase shift mask is enabled.

A halftone phase shift mask employing this halftone phase shift method is now described with reference to FIGS. 12 and 13. FIG. 12 is a plan view of the halftone phase shift mask, and FIG. 13 is a sectional view taken along the line X–X' in FIG. 12.

This halftone phase shift mask includes an LSI circuit pattern area 2, a strip-shaped shading zone area 3 provided to enclose the LSI circuit pattern area 2, and a non-exposure area 13 provided to enclose the shading zone area 3.

The LSI circuit pattern area 2 is formed with an LSI circuit pattern employing the aforementioned halftone phase shift method. The shading zone area 3 is provided for shading light leaking through a clearance defined between the LSI circuit pattern area 2 and the blind 28 described with reference to FIG. 10.

The principle of shading with the shading zone area 3 is now described with reference to FIGS. 14 and 15. FIG. 14 is an enlarged plan view of a region enclosed with a circle A in FIG. 12, and FIG. 15 is a sectional view taken along the line X–X' in FIG. 14.

The shading zone area 3, formed by shading parts 3a and Hall patterns 3b of the same material as a phase shifter area (not shown) forming the LSI circuit pattern area 2 employing the halftone phase shift method, can reduce the intensity of exposure light transmitted therethrough to a level not exposing a target film due to the function/effect of the halftone phase shift method. The size of each Hall pattern 3b is set smaller than that of the pattern of the resolution limit of the exposure unit so that each side is several $\mu$m, for example. Therefore, the exposure light transmitted through the shading zone area 3 forms no image.

Consequently, the shading zone area 3 can substantially prevent the exposure light transmitted therethrough from leakage, for serving as a shading film.

The semiconductor substrate 14 is sequentially formed with the exposed areas 31 and 32 by the step-and-repeat system as described with reference to FIG. 10, so that a pattern 17 of the phase shift mask 25 is exposed over the entire surface of the semiconductor substrate 14 as shown in FIG. 16.

As shown in FIG. 17, areas E irradiated with the exposure light transmitted through the shading zone area 3 are formed around a pattern 17a. When the pattern 17 of the phase shift mask 25 is sequentially exposed in the step-and-repeat system in order of the pattern 17a, a pattern 17b, a pattern 17c and a pattern 17d, for example, there are formed areas 15a where the areas E overlap with adjacent patterns and areas 15b where the areas E of four patterns overlap with each other.

In each area 15a, another area E is exposed (single exposure) on the original pattern exposure. In each area 15b, other three areas E are exposed (triple exposure) on the original exposure. Thus, particularly the area 15b is irradiated with exposure light having intensity exposing the target film as a result, to exert influence on the original pattern 17.

Considering this in view of the halftone phase shift mask, it follows that the halftone phase shift mask latently has areas 18 causing single exposure on linear portions of the shading zone area 3 and areas 19 causing triple exposure on corner portions of the shading zone area 3, as shown in FIG. 18. In this regard, there has been proposed a countermeasure of providing shading members 36 preventing transmission of exposure light on the areas 19 causing triple exposure, to be enclosed with corner portions of the shading zone area 3 as shown in FIG. 19.

However, this countermeasure is unpractical due to remarkable influence on the size of the fabricated semiconductor device.

If the shading members 36 are not formed on the shading zone area 3 but separately prepared and bonded with an adhesive or the like, the shading members 36 come into contact with both of a glass substrate 4 and the shading zone area 3 having different thermal expansion coefficients. When the glass substrate 4 and the shading zone area 3 are thermally expanded respectively, therefore, the shading members 36 are disadvantageously warped.

When the shading members 36 are provided to be enclosed with the corner portions of the shading zone area 3, a shading zone of a different size must be prepared for every phase shift mask since the size of the LSI circuit pattern area 2 varies with the phase shift mask.

While the Hall patterns 3b of the shading zone area 3 may conceivably be reduced in size, the resolution limit of the exposure unit is reduced following the recent development of the exposure unit and hence it is difficult to form Hall patterns in a size smaller than the resolution limit.

As shown in FIGS. 20 and 21, a shading zone 41 having transmittance of 0% may be provided on the shading zone area 3 by film formation. In this case, however, the fabrication steps are complicated and the yield of the phase shift mask is reduced, to disadvantageously increase the fabrication cost for the phase shift mask. FIG. 21 is a sectional view taken along the line X–X' in FIG. 20.

SUMMARY OF THE INVENTION

An object of the present invention is to provide a phase shift mask, particularly a phase shift mask capable of readily implementing a structure exerting no bad influence on adjacent exposed areas when exposing a semiconductor substrate.

Another object of the present invention is to provide a semiconductor device exposed with the aforementioned phase shift mask.

A phase shift mask according to the present invention comprises a circuit pattern area having a rectangular plane shape and a strip-shaped shading zone area provided to enclose the circuit pattern area on a substrate, and a shading member is mounted on the upper side of a corner portion of the circuit pattern area enclosing a corner portion of the circuit pattern area having a rectangular shape.

According to this phase shift mask, it is possible to prevent triple exposure on an area generally causing triple exposure, precisely form the pattern of a semiconductor device, and finely fabricate a semiconductor device in high quality also when sequentially exposing a semiconductor substrate to be exposed in a step-and-repeat system.

A separately formed shading member is mounted on the upper side of the corner portion of the shading zone area causing triple exposure. Thus, the mounted shading member is smaller in size than a shading member mounted to enclose the overall LSI circuit pattern area, for example. Therefore, tension resulting from difference between the thermal expansion coefficients of a glass substrate and the shading member mounted thereon is so small that a reticle is hardly warped and the shading member is hardly separated.

The size of the corner portion of the shading zone area is constant regardless of the size of the LSI circuit pattern area, and hence the shading member can be employed regardless of the size of the phase shift mask. Thus, the cost for the shading member and that for the phase shift mask can be reduced.

Preferably, the shading member is so provided that light transmittance is gradually increased as separated from the corner portion of the circuit pattern area.

Preferably, a material having such a property that transmittance is increased as the thickness thereof is reduced, and the shading member is so provided that the thickness thereof is gradually increased as separated from the corner portion of the circuit pattern area.

Preferably, the shading member is so provided that a surface opposite to the substrate is gradually separated from a surface closer to the substrate as separated from the corner portion of the circuit pattern area.

Alternatively, the shading member is so provided that the surface closer to the substrate is gradually separated from the surface opposite to the substrate as separated from the corner portion of the circuit pattern area.

A semiconductor device according to the present invention is fabricated with a phase shift mask comprising a circuit pattern area having a rectangular plane shape and a strip-shaped shading zone area provided to enclose the circuit pattern area on a substrate, in which a shading member is mounted on the upper side of a corner portion of the circuit pattern area enclosing a corner portion of the circuit pattern area having a rectangular shape.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4(A) to 4(C) illustrate a problem of the halftone phase shift mask according to the first embodiment, while FIG. 4(A) illustrates the sectional structure of the halftone phase shift mask according to the first embodiment, FIG. 4(B) is an enlarged sectional view of a region enclosed with a circle S in FIG. 4(A), and FIG. 4(C) illustrates light intensity on a semiconductor substrate;

FIGS. 11(A) and 11(B) are diagrams for illustrating the basic principle of a halftone phase shift method, while FIG. 11(A) is a sectional view of a halftone phase shift mask, and FIG. 11(B) illustrates light intensity of exposure light transmitted through the halftone phase shift mask on a semiconductor substrate;

DESCRIPTION OF THE PREFERRED EMBODIMENTS

Embodiments of the inventive phase shift mask applied to a halftone phase shift mask are now described with reference to the drawings.

(First Embodiment)

Figure 1:
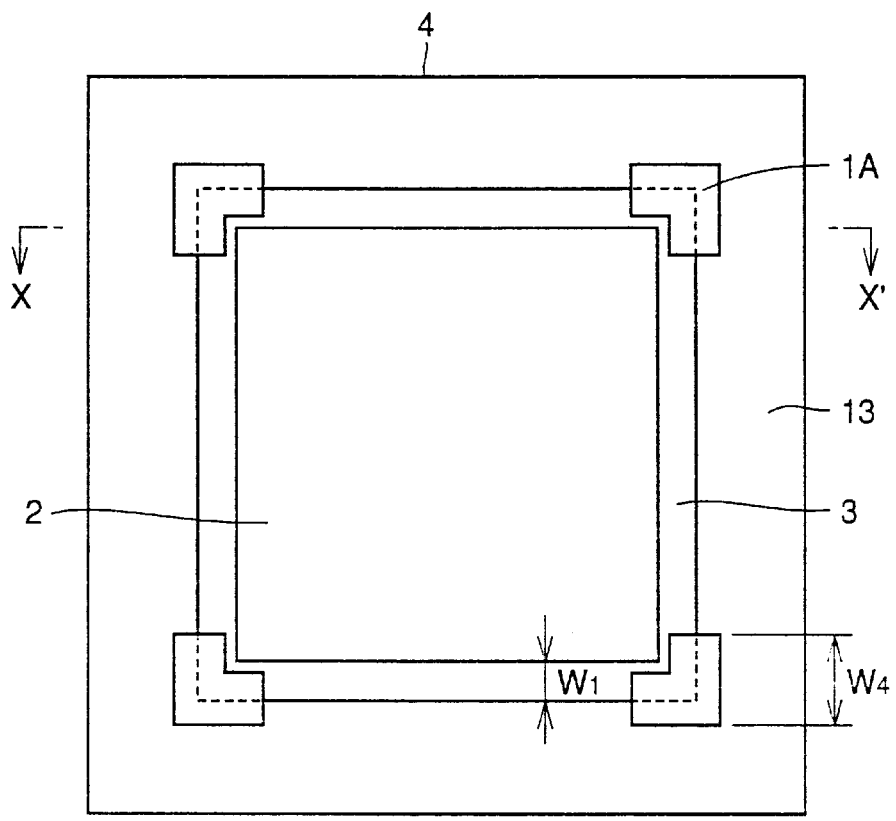
FIG. 1 is a plan view of a halftone phase shift mask according to a first embodiment of the present invention.
Figure 2:
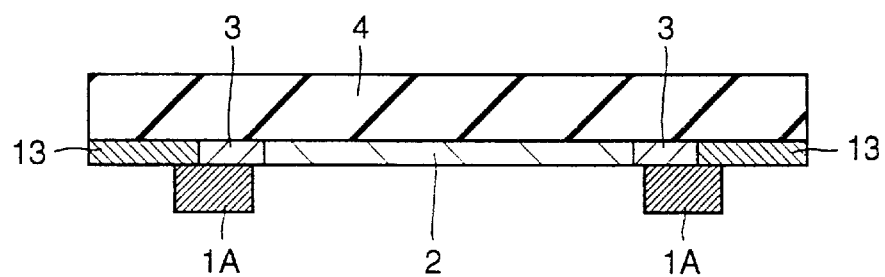
FIG. 2 is a sectional view taken along the line X–X' in FIG. 1.

The structure of a halftone phase shift mask according to a first embodiment of the present invention is described with reference to FIGS. 1 and 2. FIG. 1 is a plan view of the halftone phase shift mask, and FIG. 2 is a sectional view taken along the line X–X' in FIG. 1.

Figure 12:
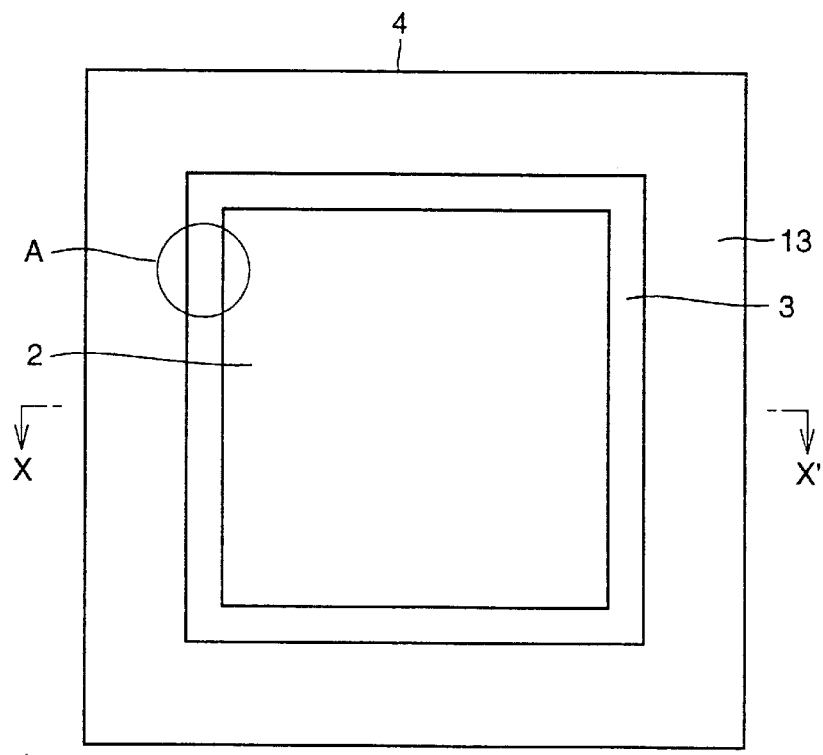
FIG. 12 is a plan view of the halftone phase shift mask.

This halftone phase shift mask includes an LSI circuit pattern area 2, a strip-shaped shading zone area 3 provided to enclose the LSI circuit pattern area 2, and a non-exposure area 13 provided to enclose the shading zone area 3. This structure is identical to that of the halftone phase shift mask shown in FIG. 12.

In the halftone phase shift mask according to the first embodiment, a glass substrate 4 of 150 mm by 150 mm having a thickness of 6.25 mm is employed, for example, and the width (W1) of the shading zone area 3 is about 1.5 mm. A masking metal forming the LSI circuit pattern area 2, the shading zone area 3 and the non-exposure area 13 is prepared from Cr, MoSiO or the like.

Figure 19:
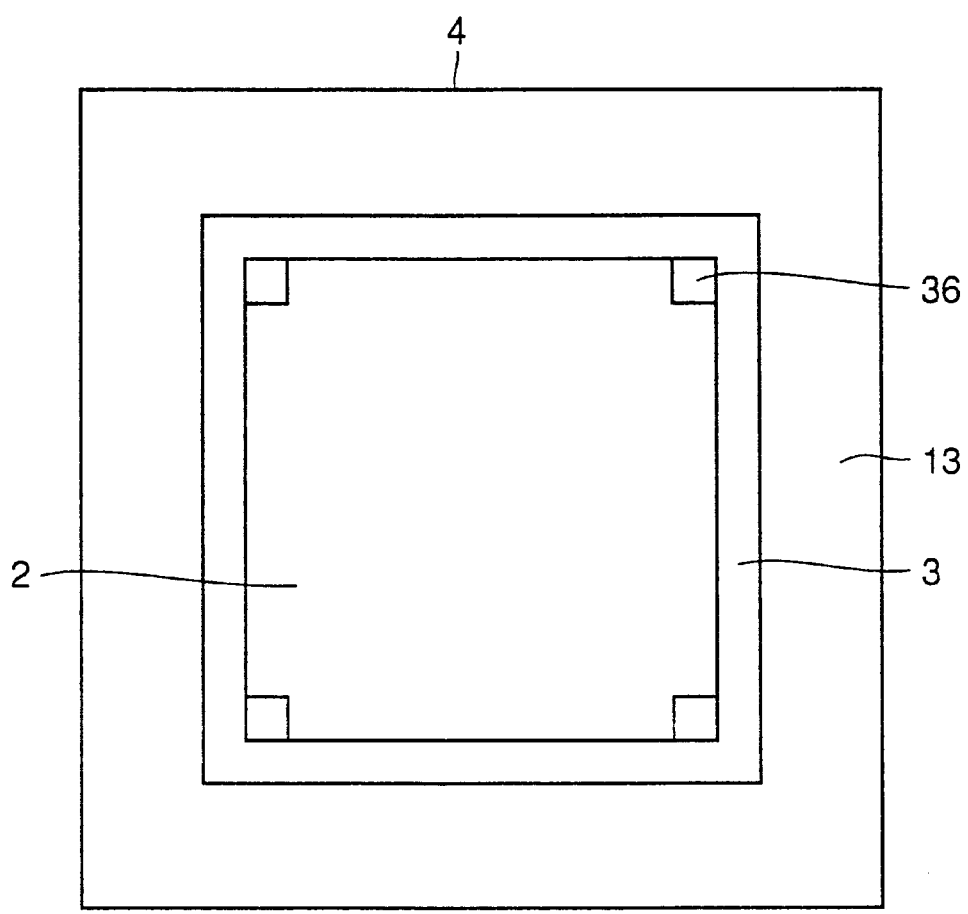
FIG. 19 is a plan view showing the structure of a conventional halftone phase shift mask proposed for solving the problem of triple exposure.
Figure 20:
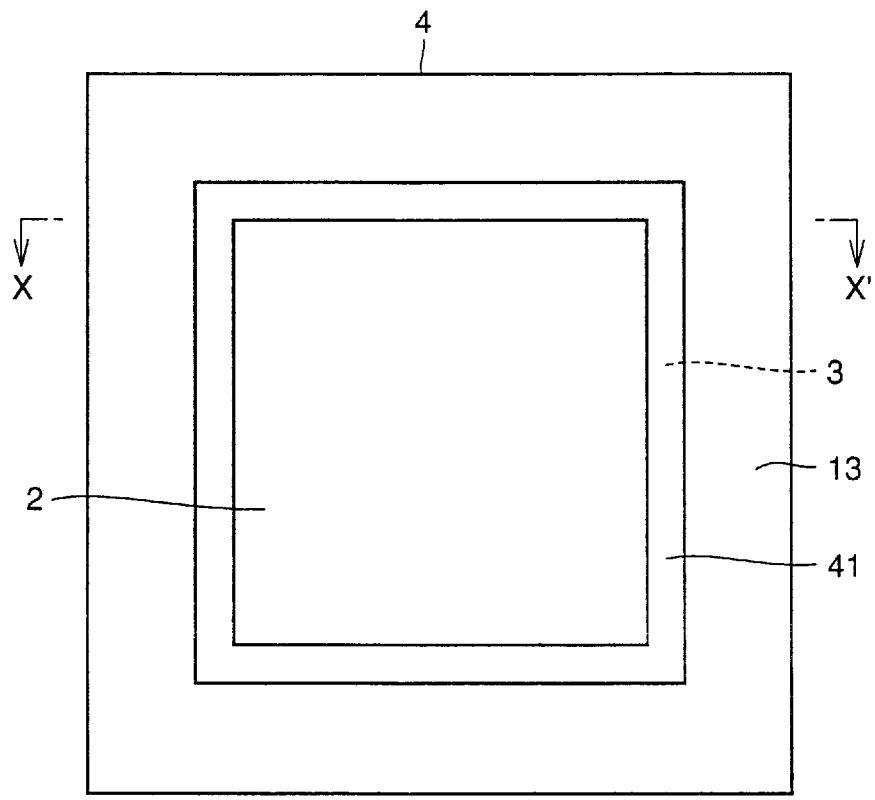
FIG. 20 is a plan view of a halftone phase shift mask having another countermeasure for solving the problem of the conventional halftone phase shift mask.
Figure 21:
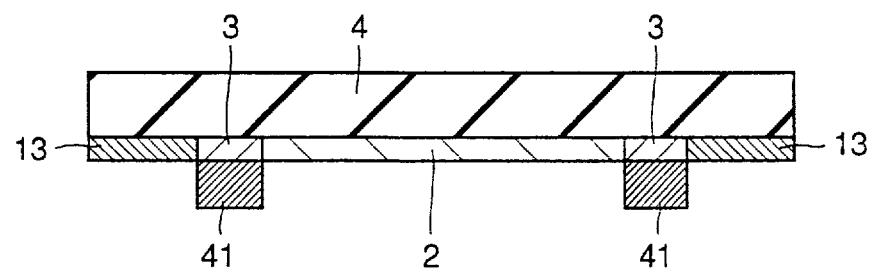
FIG. 21 is a sectional view taken along the line X–X' in FIG. 20.

The feature of the halftone phase shift mask according to this embodiment resides in that a shading member 1A is mounted on the upper side of a region of each corner portion of the shading zone area 3 corresponding to the area 19 causing triple exposure described with reference to FIG. 19.

The shading member 1A is so provided that the width (W4) thereof is about 1.5+αmm, i.e., at least larger than the width of the shading zone area 3. The shading member 1A is made of a material having a property of absorbing light having the exposure wavelength of an exposure unit.

Figure 3A:
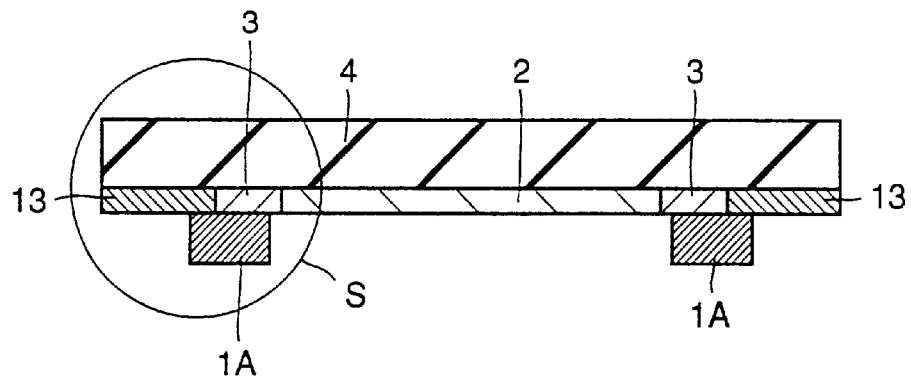
FIG. 3(A) illustrates the sectional structure of the halftone phase shift mask according to the first embodiment.
Figure 3B:
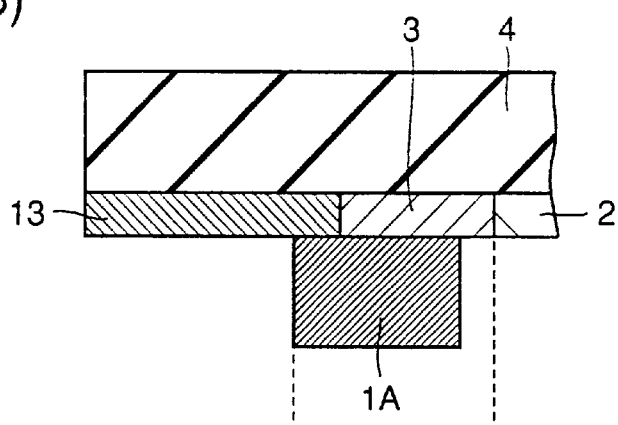
FIG. 3(B) is an enlarged sectional view of a region enclosed with a circle S in FIG. 3(A)
Figure 3C:
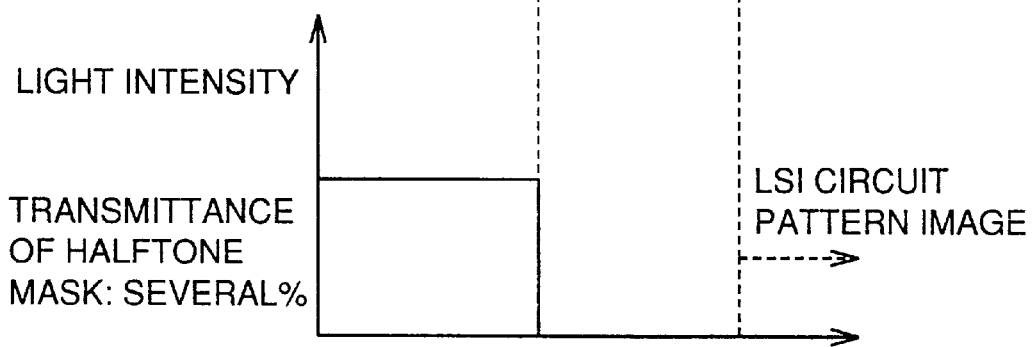
FIG. 3(C) illustrates light intensity on a semiconductor substrate.

FIG. 3(C) illustrates the light intensity of exposure light, transmitted through the halftone phase shift mask provided with the shading member 1A, on a semiconductor substrate. FIG. 3(A) is a sectional view of the halftone phase shift mask taken along the line X–X' in FIG. 1 similarly to FIG. 2, and FIG. 3(B) is an enlarged sectional view of a region enclosed with a circle S in FIG. 3(A).

As clearly understood from FIGS. 3(A), 3(B) and 3(C), the exposure light can be reliably prevented from transmission through the region of each corner portion of the shading zone area 3, causing triple exposure, by bonding the separately formed shading member 1A to the upper side of the region.

The shading member 1A employed in this embodiment is smaller than a shading member mounted to enclose the overall periphery of the LSI circuit pattern area 2. Thus, tension resulting from difference between the thermal expansion coefficients of the glass substrate 4 and the shading member 1A mounted thereon is so small that a reticle is hardly warped and the shading member 1A is hardly separated.

The size of the corner portion of the shading zone area 3 is constant regardless of the size of the LSI circuit pattern area 2. Thus, the shading member 1A can be employed regardless of the size of the halftone phase shift mask, whereby the cost for the shading member 1A and that for the halftone phase shift mask can be reduced. Further, the shading member 1A may be simply bonded to the corner portion of the shading zone area 3, and hence the fabrication yield of the halftone phase shift mask is not reduced.

(Second Embodiment)

Figure 4A:
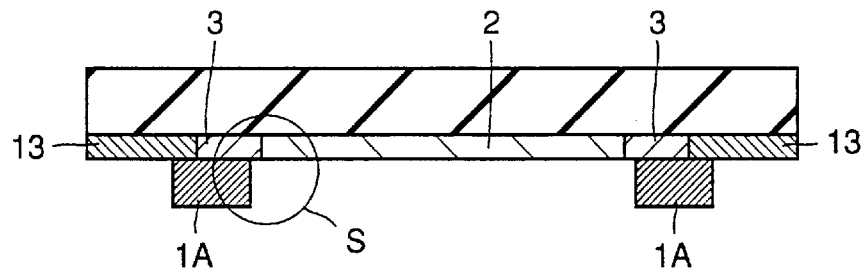
Figure 4B:
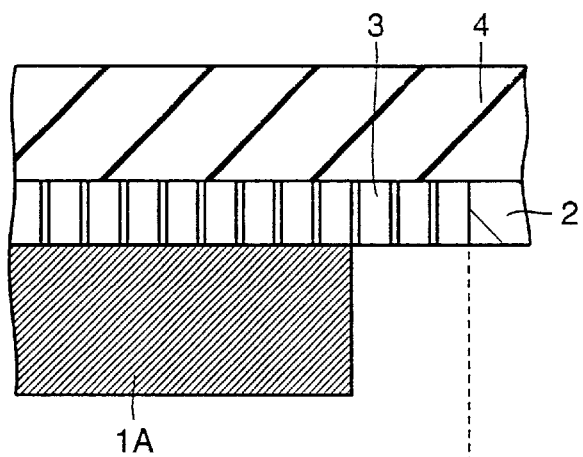
Figure 4C:
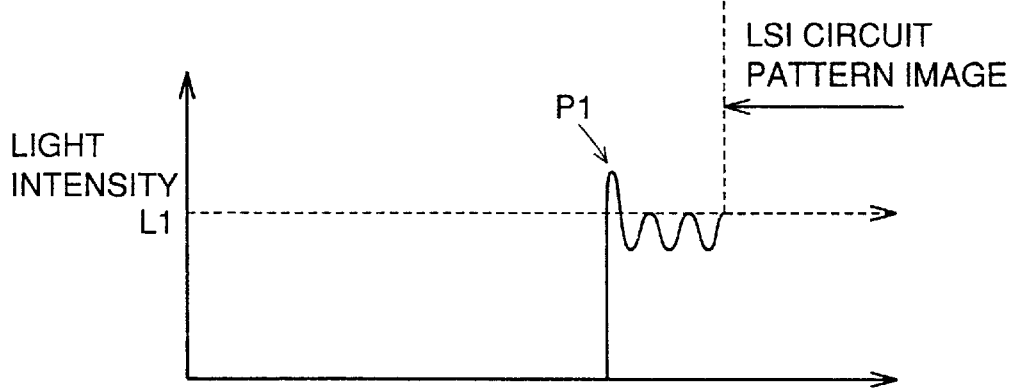

The halftone phase shift mask according to the first embodiment may cause the following problem, which is now described with reference to FIGS. 4(A), 4(B) and 4(C). FIG. 4(A) illustrates the sectional structure of the halftone phase shift mask according to the first embodiment, FIG. 4(B) is an enlarged sectional view of a region enclosed with a circle S in FIG. 4(A), and FIG. 4(C) illustrates light intensity on a semiconductor substrate.

Figure 13:
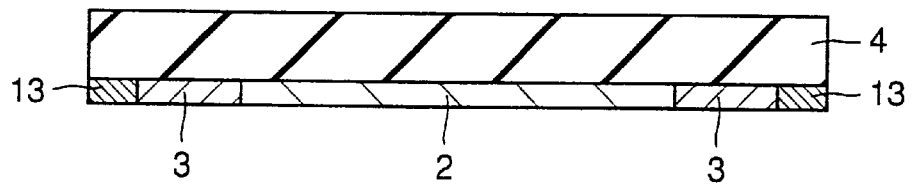
FIG. 13 is a sectional view taken along the line X–X' in FIG. 12.
Figure 14:
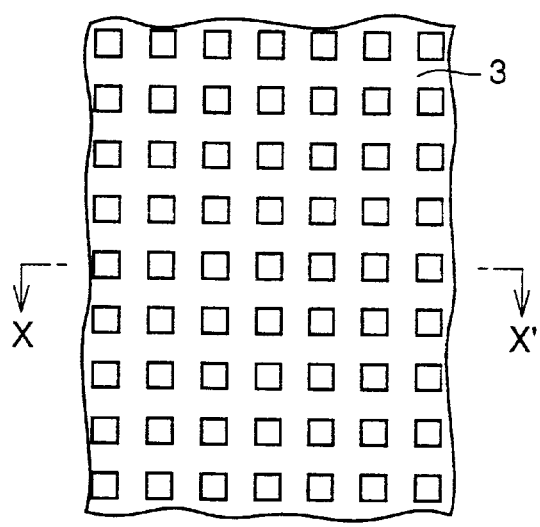
FIG. 14 is an enlarged plan view of a region enclosed with a circle A in FIG. 12.
Figure 15:
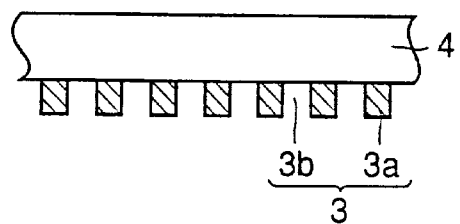
FIG. 15 is a sectional view taken along the line X–X' in FIG. 14.
Figure 16:
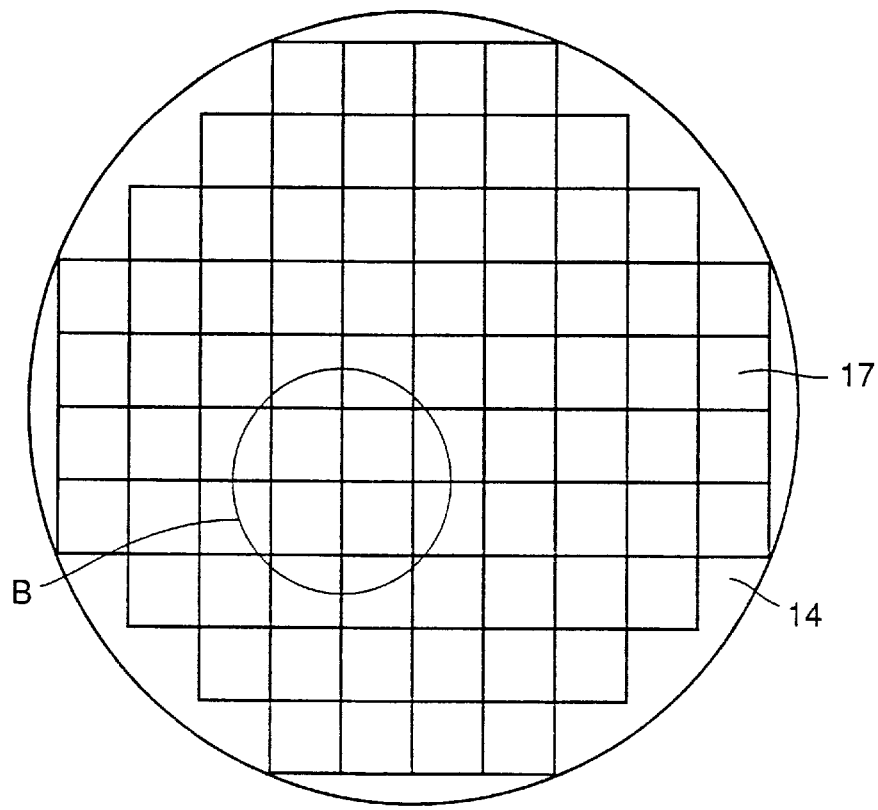
FIG. 16 is a plan view of a semiconductor substrate 14 with a patter 17 exposed over the entire surface.
Figure 17:
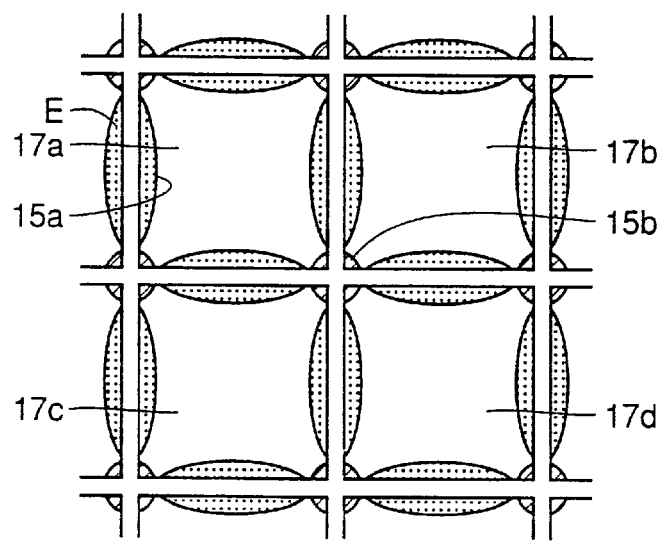
FIG. 17 is a model diagram for illustrating problems of single exposure and triple exposure.
Figure 18:
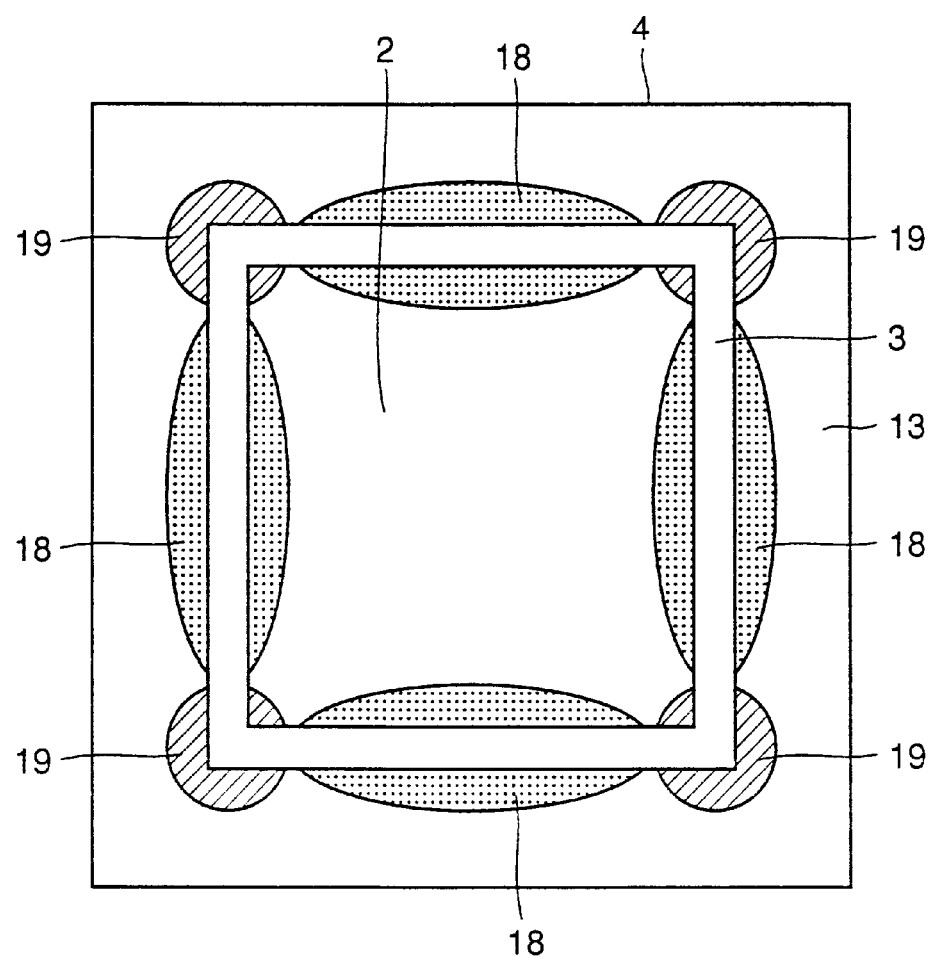
FIG. 18 is a model diagram for illustrating areas 18 causing single exposure and areas 19 causing triple exposure latent in a conventional halftone phase shift mask.

The shading zone area 3 originally formed by Hall patterns can block light due to continuously provided Hall parts and halftone parts. If the shading zone area 3 having the Hall patterns 3b shown in FIGS. 13 to 15 is applied to the shading zone area 3 of the halftone phase shift mask according to the first embodiment, however, the continuity of the shading zone area 3 is broken by the shading member 1A bonded onto the same to disadvantageously result in a strong light intensity part P1 on the boundary between the shading member 1A and the shading zone area 3, as shown in FIGS. 4(A) to 4(C). A halftone phase shift mask according to a second embodiment of the present invention has a structure solving this problem.

Figure 5:
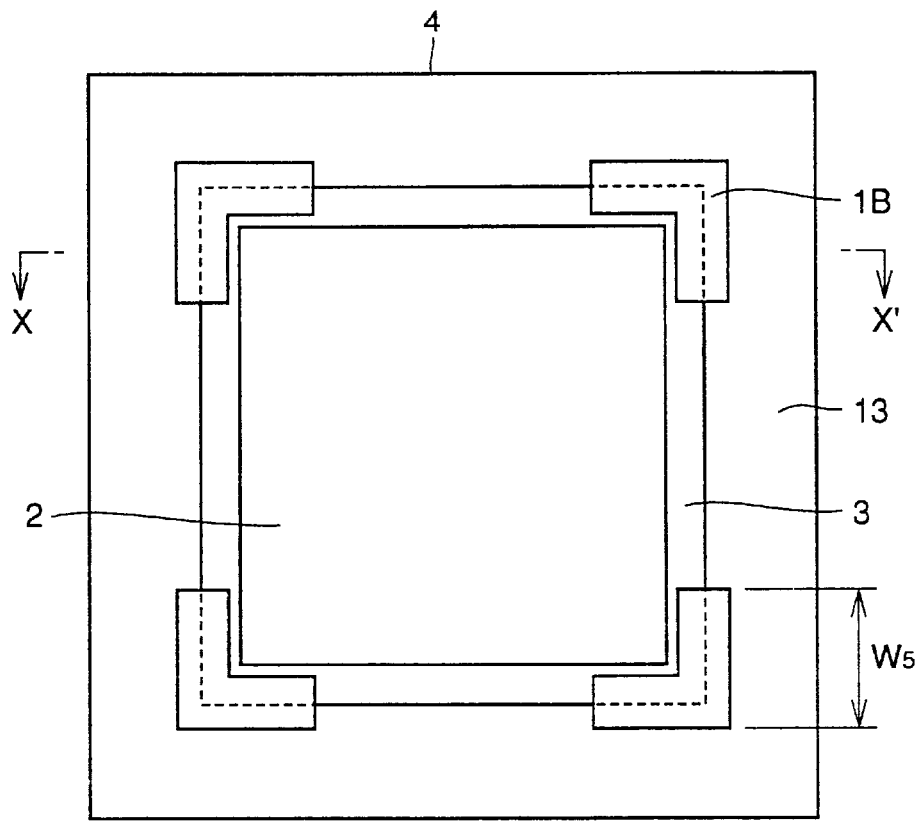
FIG. 5 is a plan view of a halftone phase shift mask according to a second embodiment of the present invention.
Figure 6A:
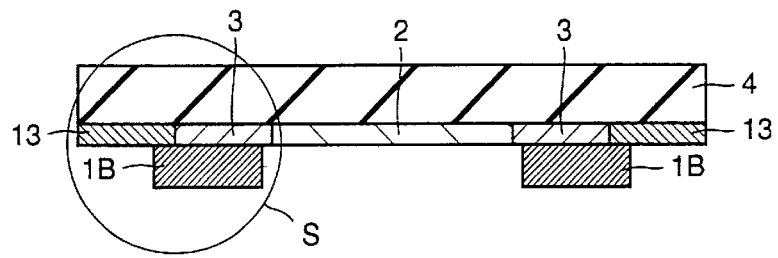
FIG. 6(A) illustrates the sectional structure of the halftone phase shift mask according to the second embodiment.
Figure 6B:
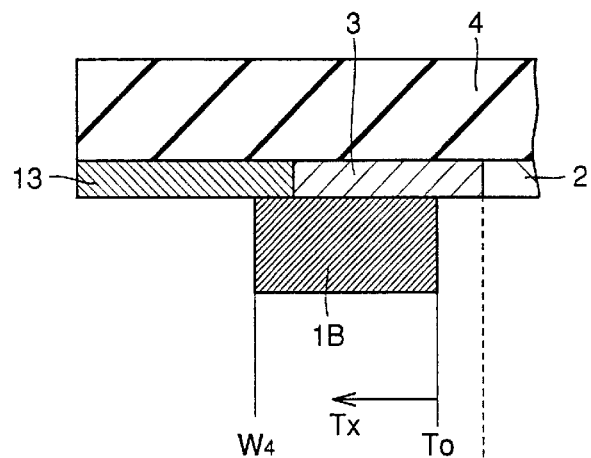
FIG. 6(B) is an enlarged sectional view of a region enclosed with a circle S in FIG. 6(A)

The structure of the halftone phase shift mask according to the second embodiment is now described with reference to FIGS. 5 and 6(A) to 6(C). FIG. 5 is a plan view of the halftone phase shift mask according to the second embodiment, FIG. 6(A) is a sectional view of the halftone phase shift mask taken along the line X–X' in FIG. 5, FIG. 6(B) is an enlarged sectional view of a region enclosed with a circle S in FIG. 6(A), and FIG. 6(C) illustrates light intensity of exposure light, transmitted through the halftone phase shift mask according to this embodiment, on a semiconductor substrate.

Figure 7:
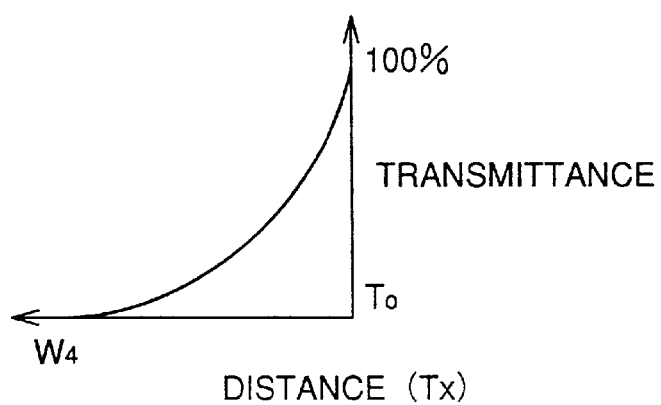
FIG. 7 illustrates transmittance of a shading member 1B.

In the halftone phase shift mask according to this embodiment, the transmittance of a shading member 1B is set to be gradually reduced (100% to 0%) as separated from each corner portion of a circuit pattern area 2, as shown in FIG. 7. Further, the shading member 1B is made of a material having a property of absorbing light of the exposure wavelength of an exposure unit.

Figure 6C:
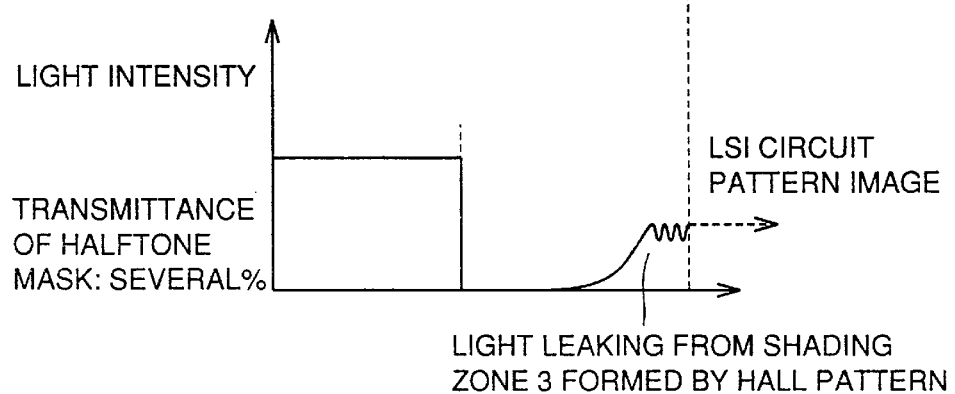
FIG. 6(C) illustrates light intensity on a semiconductor substrate.

When the shading member 1B having such an optical property is bonded to each corner portion of a shading zone area 3, no peak of light intensity appears on the boundary between the shading member 1B and the LSI circuit pattern area 2, as shown in FIG. 6(C).

Consequently, requirement for the accuracy of positional relation between the shading member 1B and the shading zone area 3 formed by Hall patterns is relaxed in addition to function/effect similar to that of the halftone phase shift mask according to the first embodiment, and exposure light can be blocked even if the bonding accuracy for the shading member 1B is inferior.

(Third Embodiment)

Figure 8A:
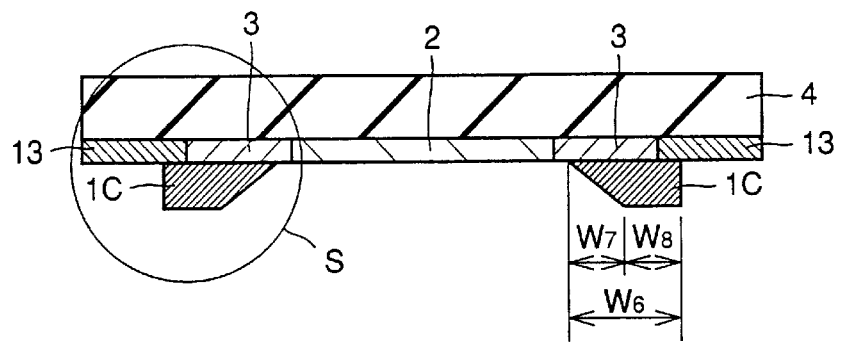
FIG. 8(A) illustrates the sectional structure of a halftone phase shift mask according to a third embodiment of the present invention.

The structure of a halftone phase shift mask according to a third embodiment of the present invention is now described with reference to FIGS. 8(A), 8(B) and 8(C). FIG. 8(A) illustrates the sectional structure of the halftone phase shift mask according to the third embodiment, FIG. 8(B) is an enlarged sectional view of a region enclosed with a circle S in FIG. 8(A), and FIG. 8(C) illustrates light intensity of exposure light, transmitted through the halftone phase shift mask according to the third embodiment, on a semiconductor substrate.

In the halftone phase shift mask according to the third embodiment, aiming at attaining the same function/effect as the second embodiment, the transmittance of a shading member 1C is set to be gradually reduced (100% to 0%) as separated from each corner portion of a circuit pattern area 2 as shown in FIGS. 7 and 8, similarly to the shading member 1B.

Figure 8B:
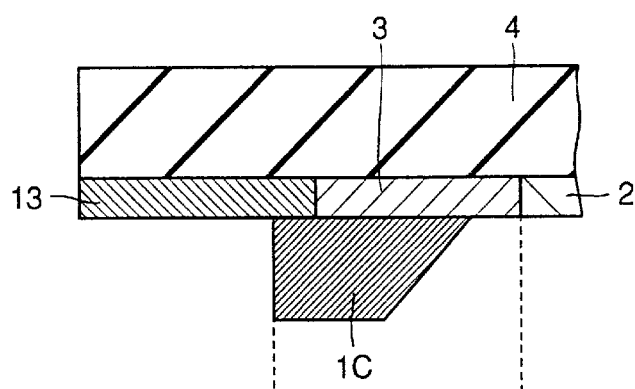
FIG. 8(B) is an enlarged sectional view of a region enclosed with a circle S in FIG. 8(A)
Figure 8C:
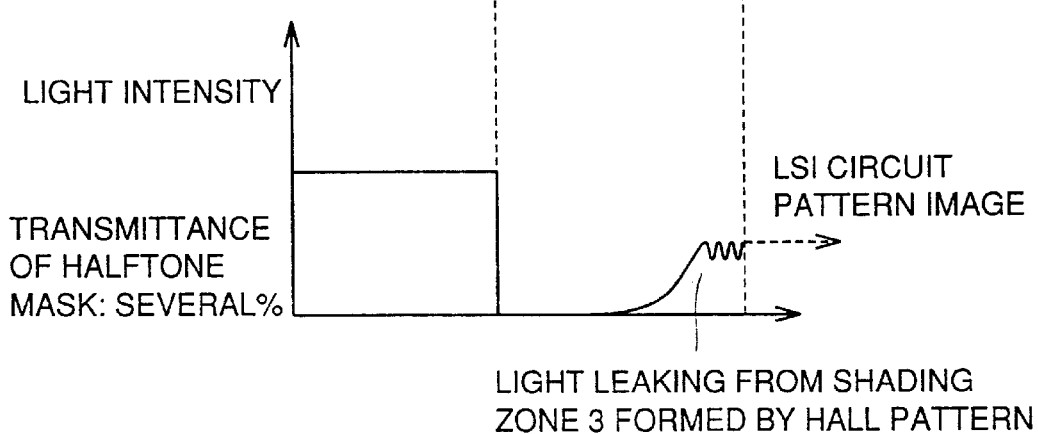
FIG. 8(C) illustrates light intensity on a semiconductor substrate.

As shown in FIGS. 8(A) and 8(B), the shading member 1C according to this embodiment is so provided that a surface opposite to a glass substrate 4 is gradually separated from a surface closer to the glass substrate 4 while the thickness thereof is increased as separated from the corner portion of the circuit pattern area 2.

The shading member 1C is made of a material having such a property that the transmittance is increased as the thickness thereof is reduced, for absorbing light having the exposure wavelength of an exposure unit. More specifically, glass containing coloring matter is preferably employed due to the freely adjustable transmittance.

With the shading member 1C having the aforementioned structure, the same light intensity as that in the second embodiment shown in FIG. 6(C) can be attained as shown in FIG. 8(C). FIG. 8(C) illustrates the light intensity of exposure light, transmitted through the halftone phase shift mask according to the third embodiment, on a semiconductor substrate.

(Fourth Embodiment)

Figure 9A:
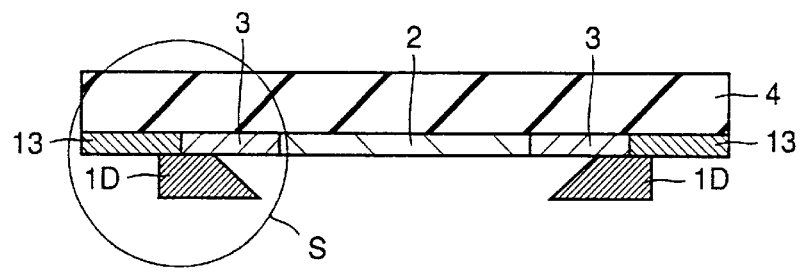
FIG. 9(A) illustrates the sectional structure of a halftone phase shift mask according to a fourth embodiment of the present invention.

The structure of a halftone phase shift mask according to a fourth embodiment of the present invention is now described with reference to FIGS. 9(A), 9(B) and 9(C). FIG. 9(A) is a sectional view of the halftone phase shift mask according to the fourth embodiment, FIG. 9(B) is an enlarged sectional view of a region enclosed with a circle S in FIG. 9(A), and FIG. 9(C) illustrates light intensity of exposure light, transmitted through the halftone phase shift mask according to the fourth embodiment, on a semiconductor substrate.

While the shading member 1C according to the third embodiment is so provided that the surface opposite to the glass substrate 4 is gradually separated from the surface closer to the glass substrate 4 while the thickness thereof is increased as separated from the corner portion of the circuit pattern area 2, a shading member 1D according to the fourth embodiment is so provided that a surface closer to a glass substrate 4 is gradually separated from a surface opposite to the glass substrate 4 while the thickness thereof is increased as separated from each corner portion of a circuit pattern area 2. The material for the shading member 1D and the remaining members of the fourth embodiment are identical to those in the third embodiment.

Figure 9B:
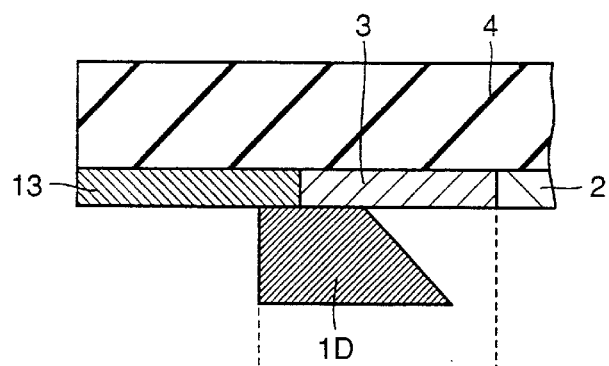
FIG. 9(B) is an enlarged sectional view of a region enclosed with a circle S in FIG. 9(A)
Figure 9C:
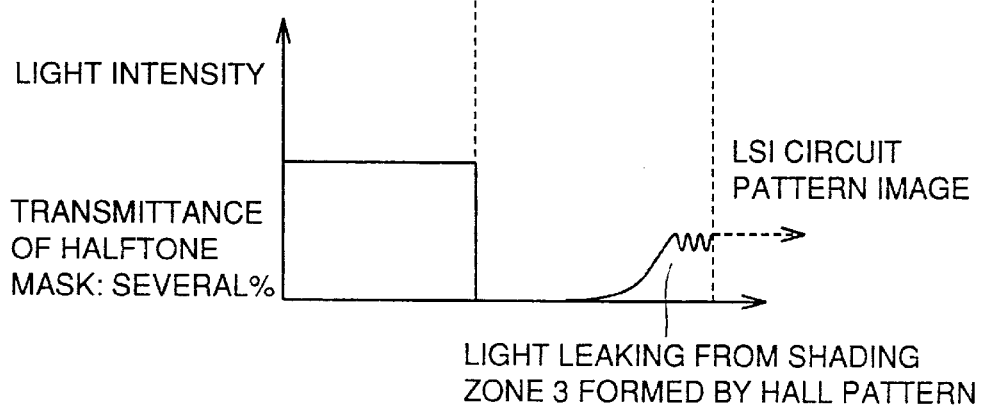
FIG. 9(C) illustrates light intensity on a semiconductor substrate.
Figure 10:
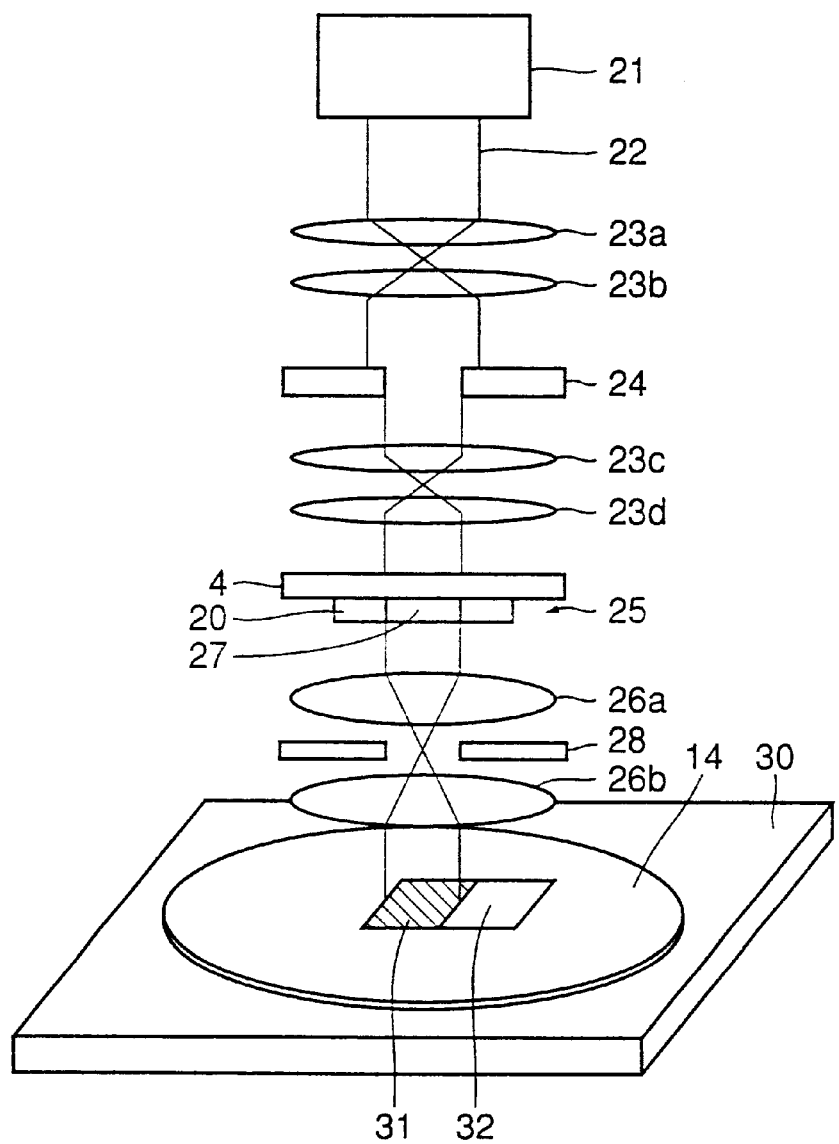
FIG. 10 is a schematic block diagram of an exposure unit employed for a step of exposing a semiconductor device.
Figure 11A:
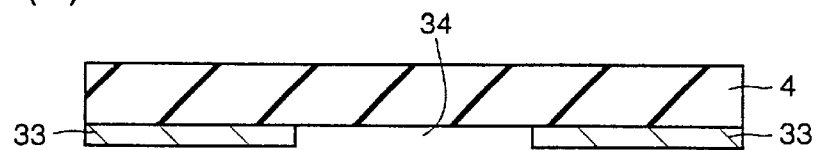
Figure 11B:
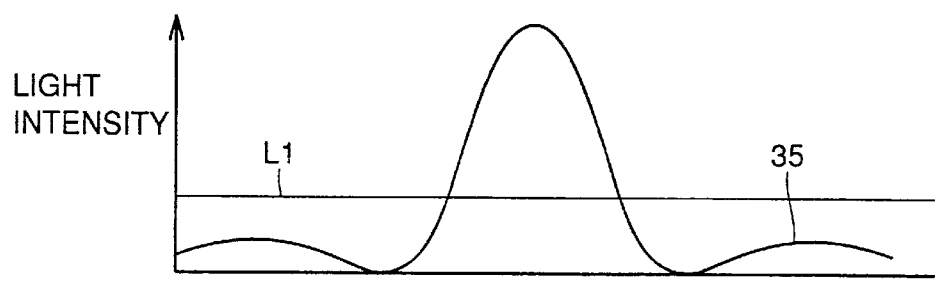

Also when employing the shading member 1D having the aforementioned structure, the same light intensity as those in the second and third embodiments shown in FIGS. 6(C) and 8(C) can be attained, as shown in FIGS. 9(B) and 9(C).

Also when sequentially exposing a semiconductor substrate with a halftone phase shift mask provided with any of the shading members 1A to 1D according to the first to fourth embodiments of the present invention in the step-and-repeat system, it is possible to prevent triple exposure on regions generally causing triple exposure, accurately form the pattern of the semiconductor device, and finely fabricate the semiconductor device in high quality.

According to the inventive phase shift mask, triple exposure can be prevented in regions generally causing triple exposure also when sequentially exposing a semiconductor substrate to be exposed in the step-and-repeat system, and it is possible to improve the fabrication yield of the semiconductor substrate as well as the fabrication yield of a semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase shift mask comprising on a substrate:

a circuit pattern area having a rectangular plane shape; and a strip-shaped shading zone area provided to enclose said circuit pattern area, wherein a shading member is mounted on the upper side of a corner portion of said shading zone area enclosing a corner portion of said circuit pattern area having a rectangular shape.

2. The phase shift mask in accordance with claim 1, wherein said shading zone area is composed of hole patterns.

3. The phase shift mask in accordance with claim 2, wherein said shading member is so provided that light transmittance is gradually reduced as separated from said corner portion of said circuit pattern area.

4. The phase shift mask in accordance with claim 3, wherein a material having such a property that transmittance is increased as the thickness of said material is reduced is employed for said shading member, and said shading member is so provided that the thickness of said shading member is gradually increased as separated from said corner portion of said circuit pattern area.

5. The phase shift mask in accordance with claim 4, wherein said shading member is so provided that a surface opposite to said substrate is separated from a surface closer to said substrate as separated from said corner portion of said circuit pattern area.

6. The phase shift mask in accordance with claim 4, wherein said shading member is so provided that a surface closer to said substrate is separated from a surface opposite to said substrate as separated from said corner portion of said circuit pattern area.

7. The phase shift mask of claim 1, wherein said shading member overlaps at least a portion of said shading zone area.

* * * * *